United States Patent [19]
Oda et al.

[11] Patent Number: 5,248,378
[45] Date of Patent: Sep. 28, 1993

[54] METHOD AND APPARATUS FOR PRODUCING SILICON SINGLE CRYSTAL

[75] Inventors: Tetsuhiro Oda, Takefu; Izumi Fusegawa; Hirotoshi Yamagishi, both of Annaka; Atsushi Iwasaki; Akiho Maeda, both of Takefu; Shinobu Takeyasu, Fukui; Nobuyoshi Fujimaki, Annaka; Yukio Karasawa, Takasaki, all of Japan

[73] Assignee: Shin-Etsu Handotai Co., Ltd., Tokyo, Japan

[21] Appl. No.: 852,612

[22] Filed: Mar. 17, 1992

[30] Foreign Application Priority Data

Mar. 20, 1991 [JP] Japan .................................. 3-081837

[51] Int. Cl.⁵ ............................................ C30B 15/34
[52] U.S. Cl. ................................. 156/617.1; 156/600; 156/618.1; 156/620.4; 156/DIG. 64; 156/DIG. 89; 422/245; 422/249
[58] Field of Search ................... 156/600, 617.1, 618.1, 156/620.4, DIG. 64, DIG. 89; 422/245, 249

[56] References Cited

U.S. PATENT DOCUMENTS

| | | | |
|---|---|---|---|
| 4,863,554 | 9/1989 | Kawasaki et al. | 156/617.1 |
| 4,915,773 | 4/1990 | Kravetsky et al. | 156/617.1 |
| 4,956,153 | 9/1990 | Yamagishi et al. | 422/249 |
| 4,957,713 | 9/1990 | Kravetsky et al. | 156/617.1 |
| 4,981,549 | 1/1991 | Vanashita et al. | 156/620.4 |
| 5,009,865 | 4/1991 | Boden et al. | 156/617.1 |

FOREIGN PATENT DOCUMENTS

| | | |
|---|---|---|
| 0371854 | 6/1990 | European Pat. Off. . |
| 0422243 | 4/1991 | European Pat. Off. . |
| 2163367A | 8/1985 | United Kingdom . |

OTHER PUBLICATIONS

Patent Abstracts of Japan, unexamined applications, C. field, vol. 12, No. 59, Feb. 23, 1988, The Patent Office Japanese Government, p. 5 C 478.

*Primary Examiner*—Robert Kunemuno
*Assistant Examiner*—Felisa Garrett
*Attorney, Agent, or Firm*—Nikaido, Marmelstein, Murray & Oram

[57] ABSTRACT

A method of producing a Czochralski-grown silicon single crystal stably and efficiently with high production yield comprises the steps of setting pulling conditions such that at least a portion of a growing silicon single crystal having a temperature in excess of 1150° C. is spaced upwardly from a surface of silicon melt by a distance greater than 280 mm; and pulling the growing silicon single crystal upward while maintaining the pulling conditions. The silicon single crystal produced by this method has an excellent oxide film dielectric breakdown strength. An apparatus for carrying out the method is also disclosed.

1 Claim, 8 Drawing Sheets

METHOD AND APPARATUS FOR PRODUCING SILICON SINGLE CRYSTAL

BACKGROUND OF THE INVENTION

1. Field of the Invention

The present invention relates to a method of and an apparatus for producing a silicon single crystal having an excellent dielectric breakdown strength of the silicon oxide film formed thereon.

2. Description of the Prior Art

It is well known in the art that a silicon single crystal grown by a pulling method commonly called the Czochralski (CZ) method is produced by an apparatus which comprises a main chamber having a side wall and a top wall disposed on an upper end of the side wall and having an open central portion extending upwardly so as to form a neck portion at an upper end of the main chamber, a quartz crucible disposed in the main chamber with a heater and a thermal shield disposed between the quartz crucible and the side wall of the main chamber, and a gate valve, a pull chamber and a crystal pulling mechanism that are disposed above the neck of the main chamber for pulling a growing silicon single crystal from a silicon melt retained in the quartz crucible. It is also known that single crystal wafers (CZ wafers) prepared from the Czochralski-grown silicon single crystal have an oxide film dielectric breakdown strength which is much smaller than that of single crystal wafers (FZ wafers) prepared from a silicon single crystal grown by the float-zone (FZ) method and wafers (epitaxial wafers) with a silicon film grown by epitaxy on a single crystal substrate prepared by the CZ method. However, due to various advantageous features, the CZ wafers are widely used as a material for fabricating electronic devices. In recent years, with an increase in degree of integration of MOS devices, a demand for a MOS device having a highly reliable gate oxide film had increased. Since the reliability of the gate oxide film is influenced very much by the oxide film dielectric breakdown strength, there is a great need for a CZ wafer having an excellent oxide film dielectric breakdown strength.

To meet the foregoing demand, an attempt has been proposed, as disclosed in Japanese Patent Laid-open Publication No. 2-267195. According to the disclosed prior attempt, a CZ wafer having an excellent oxide film dielectric breakdown strength can be produced by controlling the pulling rate (i.e., the crystal growth rate) of a silicon single crystal below 0.8 mm/min.

The prior attempt is, however, not fully satisfactory because the silicon single crystals produced at the pulling rate 0.8 mm/min may have an insufficient oxide film dielectric breakdown strength. In addition, such a low pulling rate which is smaller than the conventional pulling rate of about 1.2 mm/min brings about a substantial reduction in productivity and a substantial increase in manufacturing cost of the silicon single crystal.

SUMMARY OF THE INVENTION

With the foregoing drawbacks of the prior art in view, it is an object of this invention to provide a method by which a Czochralski-grown silicon single crystal having an excellent silicon oxide film dielectric breakdown strength can be produced stably at a high production yield and which is able to improve the productivity of the silicon single crystal.

Another object of the present invention is to provides an apparatus for carrying out the method.

According to the present invention, there is provided a method of producing a silicon single crystal grown by Czochralski method, which comprises the steps of: setting pulling conditions such that at least a portion of a growing silicon single crystal having a temperature in excess of 1150° C. is spaced upwardly from a surface of silicon melt by a distance greater than 280 mm; and pulling the growing silicon single crystal upward while maintaining the pulling conditions.

When the portion of the growing silicon single crystal having a temperature above 1150° C. has a length smaller than 280 mm, the grown silicon single crystal has an insufficient silicon oxide film dielectric breakdown strength.

It is preferable that in combination with the control of thermal conditions of the growing silicon single crystal, the pulling rate is set in the range of 0.8–2 mm/min. This combination increases the oxide film dielectric breakdown strength and productivity of the silicon single crystal. A pulling rate (i.e., a crystal growth rate) less than 0.8 mm/min lowers the productivity of the silicon single crystal. Conversely, a pulling rate greater than 2 mm/min may affect the oxide film dielectric breakdown strength.

The method of this invention is carried out by an apparatus of the type including: a main chamber having a side wall and an upper wall disposed on an upper end of the side wall, the upper wall having an open central portion extending upwardly so as to form a neck portion at an upper end of the main chamber; a quartz crucible disposed in the main chamber, with a heater and a thermal shield disposed between the quartz crucible and the side wall of the main chamber in the order named; and a gate valve, a pull chamber and a crystal lift mechanism that are disposed above the neck portion of the main chamber in the order named for pulling a growing silicon single crystal upward from a silicon melt retained in the quartz crucible, wherein the improvement comprises: a heat insulator disposed in the main chamber for keeping the temperature of an upper part of a hot zone defined by and between an upper portion of the side wall and the upper wall.

More specifically, the heat insulator extends between a lower end of the neck portion of the main chamber and an upper end of the thermal shield. From the viewpoint of the heat insulating efficiency, a heat insulator having a dome-like shape is preferable. The heat insulator preferably has a composite structure composed of a graphite and a heat-insulating material. The graphite constitutes an inner lining of the heat-insulating material.

The heat insulator may be replaced by a second heater which is disposed above the first-mentioned heater for heating the growing silicon single crystal.

Furthermore, in combination with the heat insulator disposed in the upper part of the hot zone, or alternatively with the second heater, a purge tube depending from a lower end of the neck may be provided for increasing the temperature gradient of only a portion of the growing silicon single crystal located near the silicon melt surface. With the purge tube thus provided, the pulling rate can be increased by 20–50%.

The above and other objects, features and advantages of the present invention will become manifest to those versed in the art upon making reference to the detailed description and the accompanying sheets of drawings in which preferred structural embodiments incorporating the principles of the present invention are shown by way of illustrative examples.

DETAILED DESCRIPTION OF THE INVENTION

The present invention will be described below with reference to certain preferred embodiments illustrated in the accompanying drawings.

Figure 1:
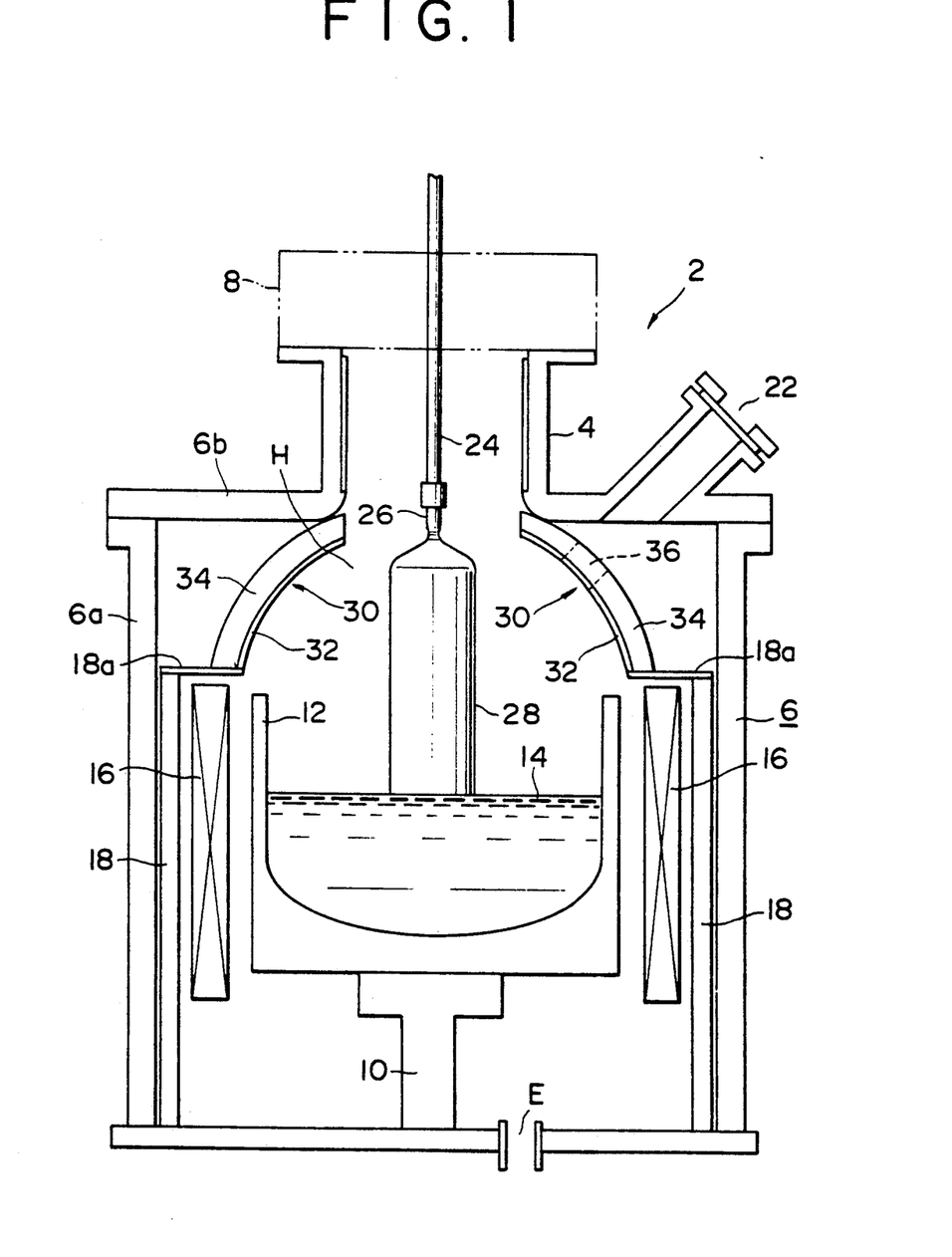
FIG. 1 is a diagrammatical fragmentary front elevational view showing the internal construction of an apparatus for producing a Czochralski-grown silicon single crystal according to a first embodiment of this invention.

Referring now to the drawings, wherein like reference characters designate like or corresponding parts throughout the several views, FIG. 1 shows an apparatus 2 for producing a silicon single crystal grown by Czochralski (CZ) method according to a first embodiment of this invention.

The apparatus 2 includes a main chamber 6 having a reduced diameter portion or neck 4 at its upper end. The main chamber 6 has an annular side wall 6a and an upper wall 6b disposed on an upper end of the side wall 6a. The upper wall 6b has an open central portion extending upwardly to form the neck portion 4 of the main chamber 6. A pull chamber (not shown) is disposed above the main chamber 6 with a gate valve 8 disposed therebetween. Disposed above the pull chamber is a crystal pulling mechanism (not shown) for pulling a growing silicon crystal 28. The pull chamber and the crystal pulling mechanism are known in the art and, hence, description and illustration thereof can be omitted.

The main chamber 6 receives therein a quartz crucible 12 rotatably supported by a vertical support shaft 10. The quartz crucible 12 contains a melt 14 of polycrystalline silicon. The quartz crucible 12 is heated by a heater 16 disposed around the quartz crucible 12. The heater 16 surrounded by a thermal shield 18 extending along an inside surface of the side wall 6a of the main chamber 6. The top wall 6b of the main chamber 6 is provided with a view port 22 for enabling observation of the interior of the main chamber 6. The main chamber 6 as a whole has a water jacket structure to prevent undue temperature rise.

A pulling means comprising a pull shaft 24 extends vertically downward from the crystal lift mechanism through the pull chamber into the main chamber 6. A seed crystal 26 is attached to a forward end of the pull shaft 24. The pull shaft 24 is vertically movable to dip the seed crystal 26 into the silicon melt 14 and then gradually pull the seed crystal 26 upwardly from the silicon melt 14 while rotating the seed crystal 26, so that a silicon single crystal 28 grown by the CZ method is produced. The pull shaft 24 may be replaced by a flexible pulling means such as a pull wire.

Reference character H designates a hot zone extending above the silicon melt 14 in the quartz crucible 12. The hot zone H is surrounded by an upper portion of the side wall 6a and the upper wall 6b of the main chamber 6. The main chamber 6 has an exhaust hole E connected with a vacuum pump (not shown). The exhaust hole E is used for exhausting an inert gas filled in the main chamber 6 and controlling the pressure of the inert gas.

The apparatus 2 further includes a heat insulator 30 for keeping the temperature of an upper part of the hot zone H. The heat insulator 30 has a composite structure composed of a graphite 32 and a heat-insulating material 34 such as a carbon fiber heat-insulator sold under the trade name "KURECA" manufactured by Kureha Chemical Industry Co., Ltd. The graphite 32 constitutes an inner lining of the heat-insulating material 34. The heat insulator 30 has a dome-like shape and extends between a lower end of the neck portion 4 and an upper end or an upper end extension 18a of the thermal shield plate 18 to interconnect the neck portion 4 and the thermal shield plate 18. The heat insulator 30 has a view hole 36 aligned with the view port 22 for the purpose of observing the interior of the main chamber 6.

The shape of the heat insulator 30 is not limited to the dome-like shape. The heat insulator 30 may be formed in a cup-like shape composed of a vertical portion extending along the inside surface of the side wall 6a, and a horizontal portion lying over an inside surface of the top wall 6b.

Figure 2:
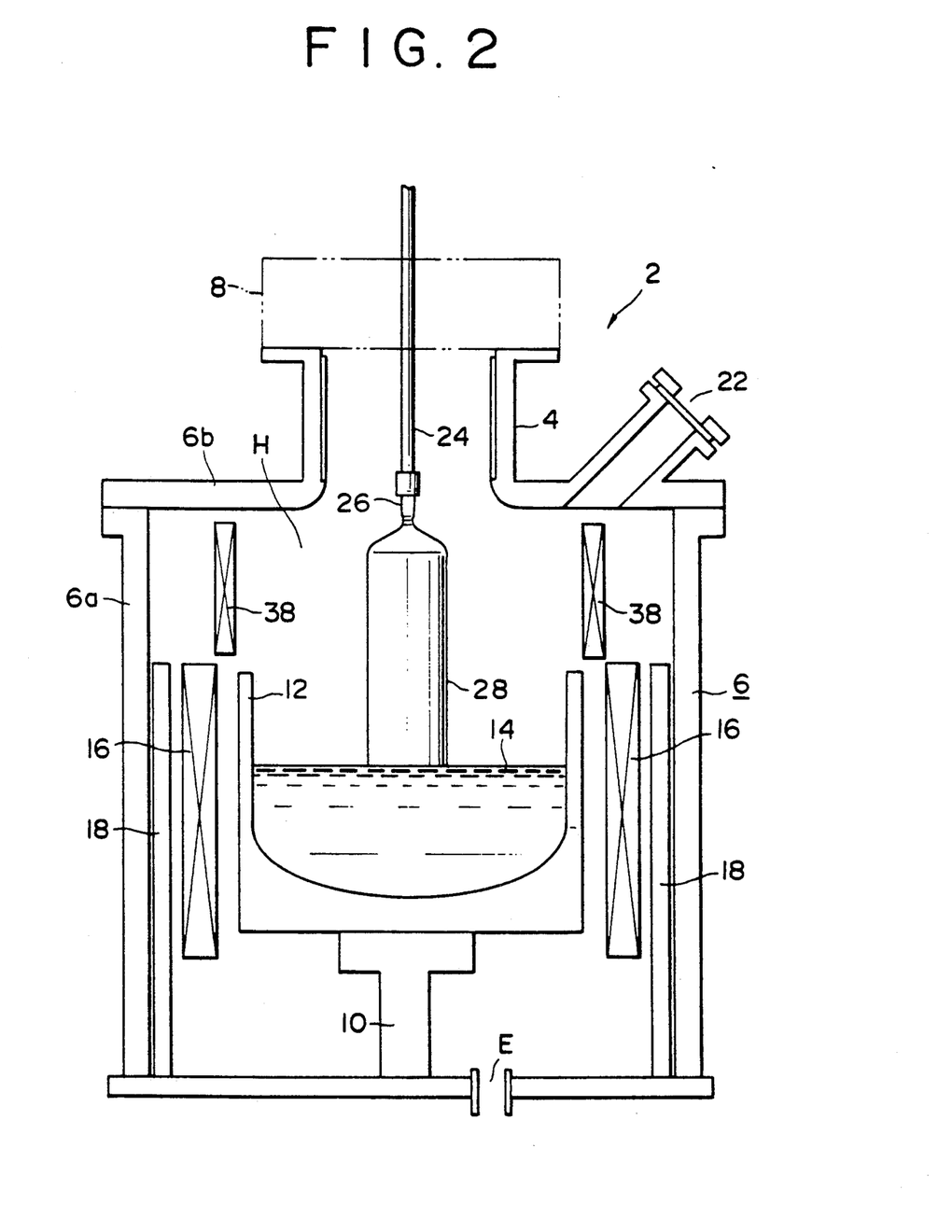
FIG. 2 is a view similar to FIG. 1, but showing the internal construction of an apparatus according to a second embodiment of this invention.

The dome-like heat insulator 30, serving as means for keeping the temperature of the upper part of the hot zone H, may be replaced by a second heater 38 for heating the growing silicon single crystal 28, as shown in FIG. 2. The second heater 38 is disposed above the heater 16 (main heater) for heating the quartz crucible 12.

It is preferable that the apparatus further includes a purge tube 40 (FIG. 3) which may be provided in combination with the dome-like heat insulator 30 shown in FIG. 1, or alternatively in combination with the second heater 38 shown in FIG. 2. As indicated by the phantom lines shown in FIG. 3, the purge tube 40 depends from a lower end of the neck portion 4 so as to cover a portion of the growing silicon single crystal 28 located adjacent to the melt surface for increasing the temperature gradient only of this portion of the growing silicon single crystal 28. With the purge tube 40 thus provided, the pulling rate can be increased by 20-50%, without affecting the oxide film dielectric breakdown strength.

The invention will be further described by way of the following examples which should be construed as illustrative rather than restrictive.

Comparative Example

Figure 3:
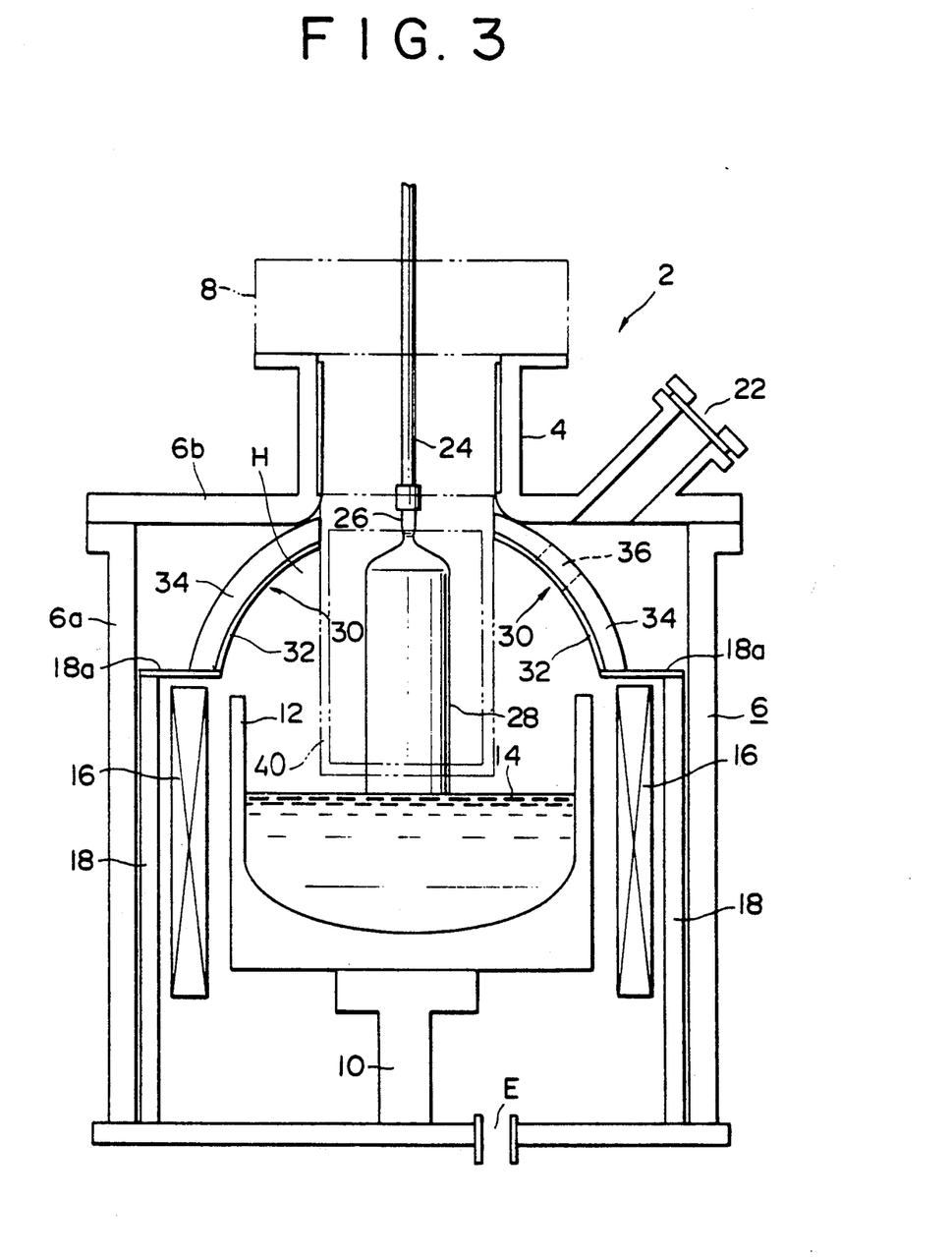
FIG. 3 is a view similar to FIG. 1, but showing the internal construction of an apparatus according to a third embodiment of this invention.

A silicon single crystal grown by Czochralski (CZ) method was pulled under the following conditions by using a conventional CZ equipment. During the pulling process, the silicon single crystal was removed from a furnace. After a platinum-rhodium platinum thermocouple was embedded in the removed silicon single crystal, the temperature distribution of a portion of the silicon single crystal extending upwardly from the silicon melt surface was measured. The results obtained are shown in FIG. 3. As indicated by the broken line (Prior Art) shown in FIG. 3, a portion of the growing silicon single crystal having a temperature ranging from 1150° to 1420° C. (i.e., the melting point of silicon) had a length (equal to the distance from the melt surface) not greater than 280 mm. Using the same CZ equipment, the pulling rate (crystal growth rate) was changed within the range of 0.4–1.6 mm/min to form various samples of silicon single crystal. The samples were processed into silicon wafers by effected the same machining processes and chemical polishing as done in the fabrication of commercial silicon wafers of 600–700 μm thick.

Figure 6:
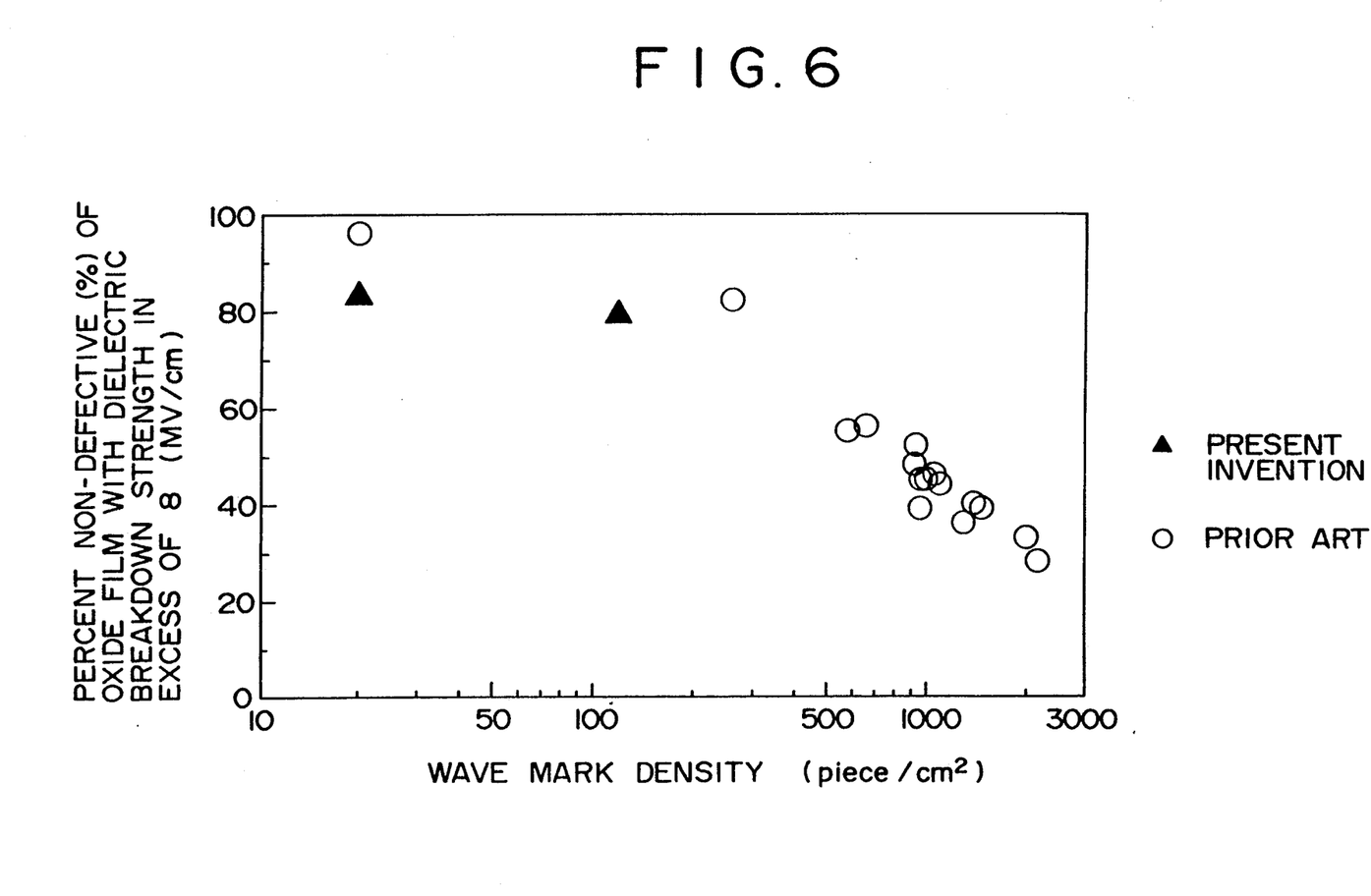
FIG. 6 is a graph showing the relationship between the wave mark density and the percent non-defective of oxide film having a dielectric breakdown strength in excess of 8 MV/cm.
Figure 7:
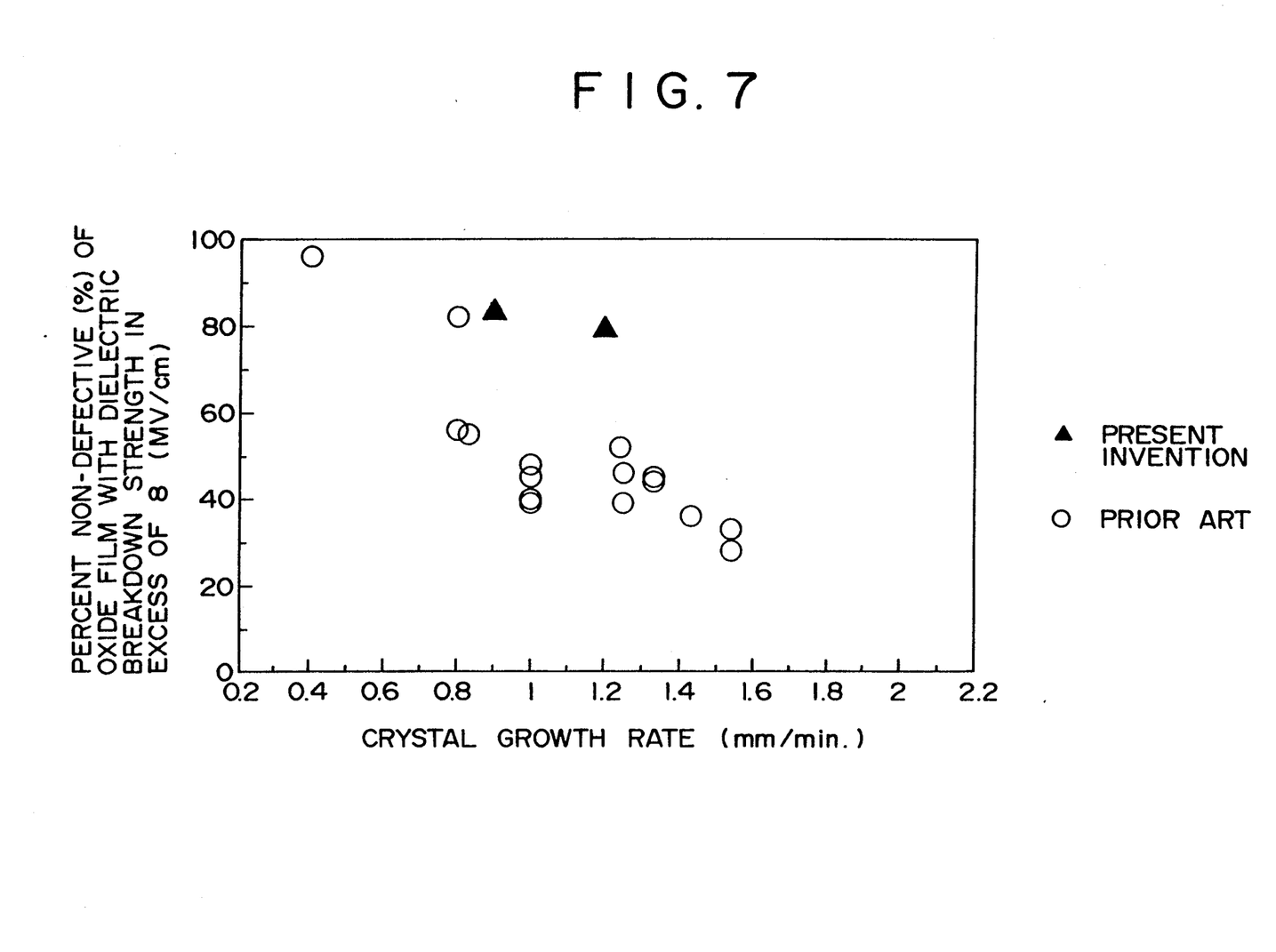
FIG. 7 is a graph showing the relationship between the crystal growth rate and the percent non-defective of oxide film having a dielectric breakdown strength in excess of 8 MV/cm.
Figure 8:
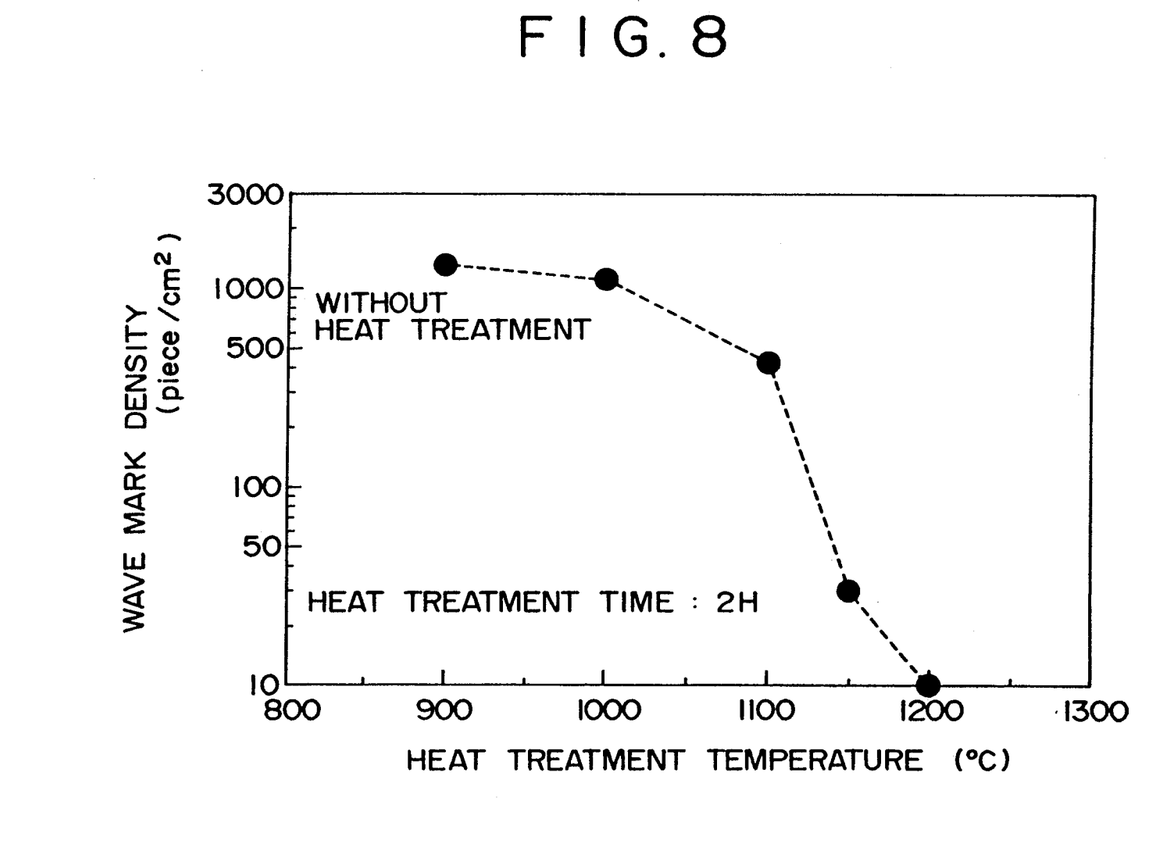
FIG. 8 is a graph showing the relationship between the heat treatment temperature and the wave mark density.

The silicon wafers were inspected to determine the defect density and the oxide film dielectric breakdown strength in conjunction with the crystal growth rate (pulling rate). The results obtained are shown in FIGS. 5–7.

For inspecting the defect density, each wafer was etched for 30 min by a preferential etching method [2 g: $K_2Cr_2O_7$, 30 mL: $H_2O$, 100 mL: HF, Secco'd Aragona, : J. Electrochem. Soc., 119, 948 (1972)]. Using an optical microscope, defects appearing on the etched wafer as wave patterns or marks were counted by visual inspection.

For evaluating the oxide film dielectric breakdown strength, 100 pieces of devices were fabricated in each silicon wafer. Each of the devices had a polysilicon gate having an area of 8 mm$^2$, and a 250 Å oxide layer formed by oxidation at 900° C. for 100 min in dry oxygen atmosphere. A dielectric breakdown test was made for each device and a device whose oxide layer having a dielectric breakdown strength greater than 8 MV/cm was evaluated as a non-defective device. Then, a percentage of the non-defective devices was given as representing the oxide film dielectric breakdown strength.

Figure 5:
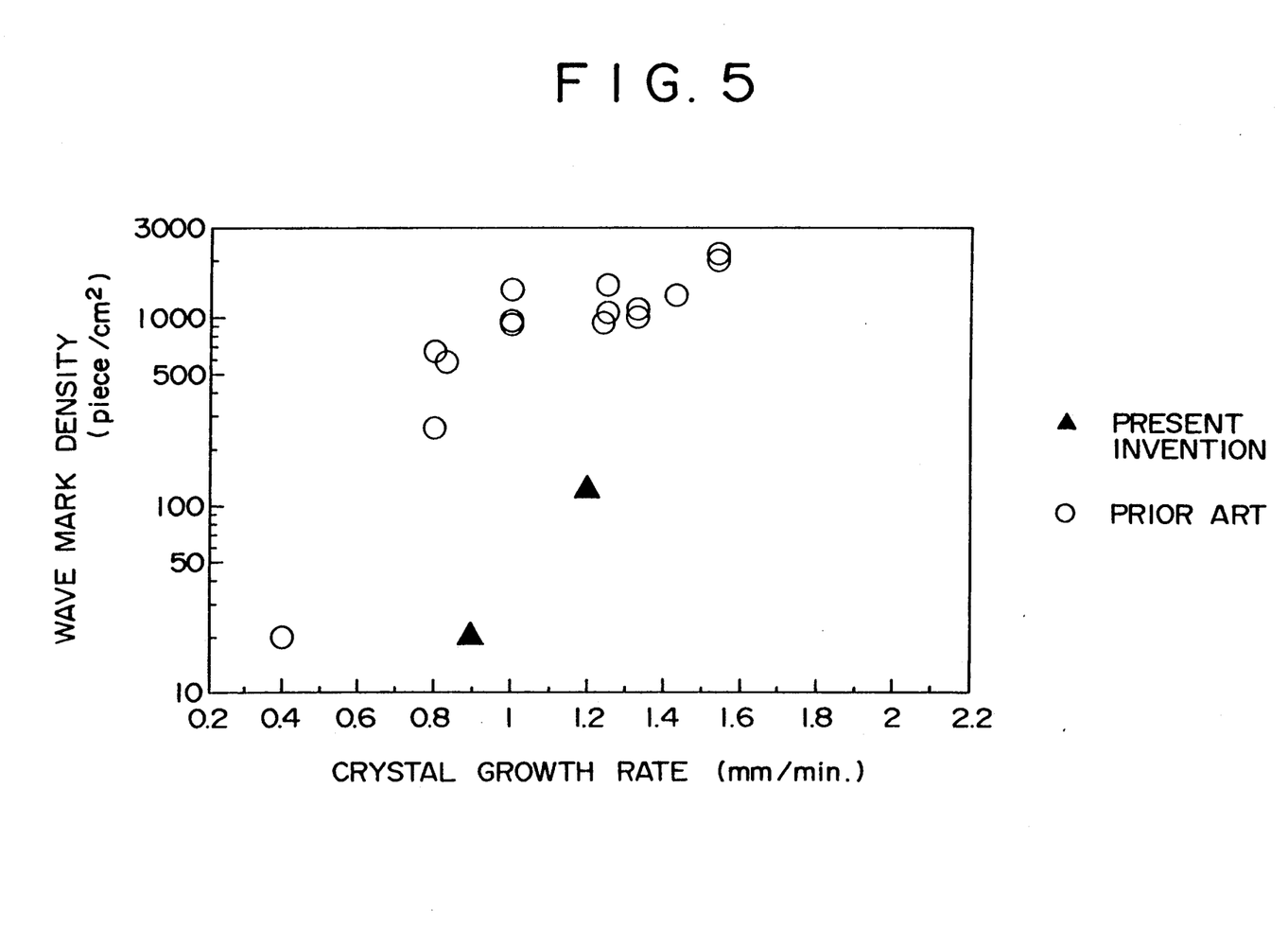
FIG. 5 is a graph showing the relationship between the crystal growth rate and the wave mark density.

The relation between the crystal growth rate and the density of wave marks counted as specified above with respect to the silicon wafers according to the Comparative Example is shown in FIG. 5. As evidenced from the distribution of circles (Prior Art) shown in FIG. 5, the wave mark density is 20 pieces/cm$^2$ when the pulling rate is as low as 0.4 mm/min. On the other hand, at the pulling rate exceeding 1 mm/min, the wave mark density is increased to more than 1000 pieces/cm$^2$.

The relation between the wave mark density and the percent non-defective of oxide film dielectric breakdown strength taken with respect to the silicon wafers of the Comparative Example is shown in FIG. 6. The distribution of circles (Prior Art) shown in FIG. 6 indicates that those silicon wafers having a high wave mark density such as 1000 pieces/cm$^2$ have a percent non-defective of oxide film dielectric breakdown strength nearly equal to 40%. The silicon wafers having a wave mark density of about 200 pieces/cm$^2$ have a percent non-defective of oxide film dielectric breakdown strength approximately equal to 80%.

The relation between the crystal growth rate and the percent non-defective of oxide film dielectric breakdown strength of the silicon wafers according to the Comparative Example is shown in FIG. 7. As appears clear from the distribution of circles (Prior Art) shown in FIG. 7, the percent non-defective of oxide film dielectric breakdown strength is 80% when the crystal growth rate is relatively low such as 0.4 mm/min. At a crystal growth rate exceeding 0.8 mm/min, the percent non-defective of oxide film dielectric breakdown strength is reduced to about 50%. This means that in the case of the conventional CZ method, a low crystal growth rate is an essential condition in order to produce a silicon single crystal having an excellent oxide film dielectric breakdown strength. The low crystal growth rate, however, results in a considerable reduction in productivity of the silicon single crystal and hence is not practically useful.

Experiment

The Comparative Example described above suggests that a reduction in defect density of the silicon single crystal brings about a substantial improvement in oxide film dielectric breakdown strength of the silicon wafers.

An experiment was made to determine the relation between the wave mark density and the heat treatment temperature when silicon wafers of about 1000 pieces/cm$^2$ in wave mark density were subjected to a heat treatment. As shown in FIG. 9, a heat treatment effected at 1100° C. for 2 hours provides only a negligible reduction in wave mark density (defect density). As against this, sharp reductions in wave mark density are attainable when the heat treatment is effected at temperatures above 1150° for 2 hours.

These experimental results have led the present inventors to an inventive idea that a grown silicon single crystal having a longer thermal history in the temperature range above 1150° C. has a considerably reduced amount of defects and an excellent oxide film dielectric breakdown strength.

Inventive Example

Figure 4:
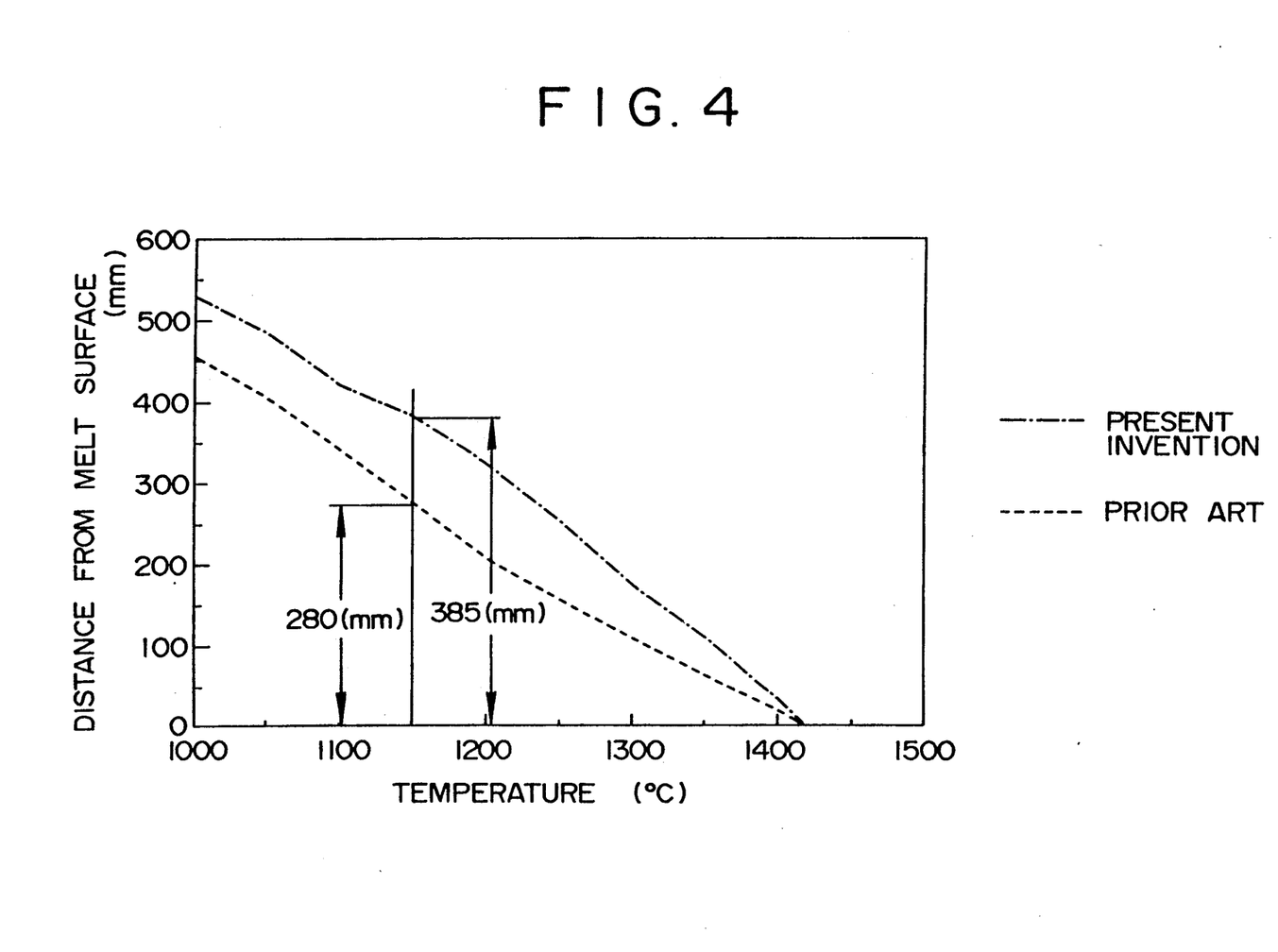
FIG. 4 is a graph showing the relationship between the distance from a silicon melt surface and the temperature of a silicon single crystal.

A silicon single crystal grown by the CZ method was produced under the same conditions as the Comparative Example with the exception that the conventional CZ equipment was replaced by the apparatus of the present invention described above. A measurement was made in the same manner as the Comparative Example for determining the temperature distribution of a portion of the silicon single crystal disposed above the melt surface. The results obtained are shown in FIG. 4. As is apparent from the phantom line (Present Invention) shown in FIG. 4, a portion of the silicon single crystal in the temperature range of from 1150° to 1420° C. (i.e., the melting point of silicon) had a length of 385 mm. Using the same CZ apparatus, two samples of silicon single crystal were pulled at different rates 0.9 mm/min and 1.2 mm/min, respectively. These samples were processed into 600–700 μm thickness silicon wafers by effecting the same machining processes and chemical polishing as done in the Comparative Example and also in the fabrication of commercial silicon wafers.

The defect density and oxide film dielectric breakdown strength of the fabricated silicon wafers were inspected in conjunction with the crystal growth rate (pulling rate). The results obtained are shown in FIGS. 5 through 7.

As indicated by triangles (Present Invention) shown in FIG. 5, the wave mark density observed at the crystal growth rate of 1.2 mm/min is 100 pieces/cm² which is smaller by one digit than the wave mark density of Comparative Example (Prior Art). An additional reduction in wave mark density (20 pieces/cm²) is obtained when the crystal growth rate is 0.9 mm/min.

Two triangles shown in FIG. 6 indicate that the silicon wafers according to the Inventive Example have a wave mark density smaller than 100 pieces/cm² and a percent non-defective of oxide film dielectric breakdown strength equal to 80%.

As shown in FIG. 7, the percent non-defective of oxide film dielectric breakdown strength of the Inventive Example (Present Invention) is not smaller than 80% irrespective of the crystal growth rate. A comparison made with respect to the same crystal growth rate 1.2 mm/min indicates that the Inventive Example (having a longer thermal history in the temperature range above 1150°) has an oxide film dielectric breakdown strength which is twice as large as that of the Comparative Example (having a shorter thermal history in the temperature range above 1150° C.).

As is obvious from the foregoing description, according to the method of this invention, a silicon single crystal having an excellent oxide film dielectric breakdown strength can be produced stably with high yield and high productivity.

obviously, various modifications and variations of the present invention are possible in the light of the above teaching. It is therefore to be understood that within the scope of the appended claims the invention may be practiced otherwise than as specifically described.

What is claimed is:

1. An apparatus for producing a silicon single crystal grown by Czochralski method, said apparatus comprising:
    a main chamber having a side wall and an upper wall disposed on an upper end of said side wall, said upper wall having an open central portion extending upwardly so as to form a neck portion at an upper end of said main chamber;
    a quartz crucible disposed in said main chamber, with a heater and a thermal shield disposed between said quartz crucible and said side wall of said main chamber;
    a heat insulator having a dome-like shape, extending between a lower end of said neck portion and an upper end of said thermal shield, and disposed in said main chamber for keeping the temperature of an upper part of a hot zone defined by and between an upper portion of said side wall and said upper wall, said heat insulator comprising a composite structure composed of a graphite and a heat-insulating material, said graphite forming an inner lining of said heat-insulating material; and
    a gate valve, a pull chamber and a crystal lift mechanism disposed above said neck portion of said main chamber for pulling a growing silicon single crystal upward from a silicon melt retained in said quartz crucible.

* * * * *